United States Patent
Kim et al.

(10) Patent No.: US 9,748,118 B2
(45) Date of Patent: Aug. 29, 2017

(54) SUBSTRATE TREATING APPARATUS

(71) Applicant: Semes Co., Ltd., Cheonan-si, Chungcheongnam-do (KR)

(72) Inventors: Yu-Hwan Kim, Cheonan-si (KR); Jung-Bong Choi, Cheonan-si (KR); Ho-Jong Hwang, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 152 days.

(21) Appl. No.: 14/446,671

(22) Filed: Jul. 30, 2014

(65) Prior Publication Data
US 2015/0034133 A1 Feb. 5, 2015

(30) Foreign Application Priority Data

Jul. 31, 2013 (KR) .................. 10-2013-0090815
Dec. 26, 2013 (KR) .................. 10-2013-0164394

(51) Int. Cl.
H01L 21/67 (2006.01)
(52) U.S. Cl.
CPC .. *H01L 21/67051* (2013.01); *H01L 21/67115* (2013.01)
(58) Field of Classification Search
None
See application file for complete search history.

(56) References Cited

U.S. PATENT DOCUMENTS

| 5,932,009 A * | 8/1999 | Kim ................. B05C 11/08 118/500 |
| 7,993,057 B2 * | 8/2011 | Aggarwal .............. G01K 7/04 136/227 |
| 2004/0112885 A1 * | 6/2004 | Shigeoka ......... H01L 21/67115 219/388 |
| 2008/0032036 A1 * | 2/2008 | Ito ..................... C23C 16/46 427/8 |
| 2008/0280453 A1 * | 11/2008 | Koelmel ......... H01L 21/67115 438/758 |
| 2009/0108486 A1 * | 4/2009 | Babin .................... G03F 7/40 264/82 |
| 2010/0111511 A1 * | 5/2010 | Merry .................. C23C 16/481 392/411 |

(Continued)

FOREIGN PATENT DOCUMENTS

CN 101155662 A 4/2008
CN 101911281 A 12/2010
(Continued)

*Primary Examiner* — Michael Barr
*Assistant Examiner* — Cristi Tate-Sims
(74) *Attorney, Agent, or Firm* — Harness, Dickey & Pierce P.L.C.

(57) ABSTRACT

Provided is a substrate treating apparatus. The substrate treating apparatus includes a treating container having an opened upper portion, a substrate heating unit heating a substrate disposed in the treating container while supporting the substrate, and a treating solution supply unit supplying a treating solution onto the substrate disposed on the substrate heating unit. The substrate heating unit includes a rotatable chuck stage on which the substrate is placed, a rotation part having a hollow shape, the rotation part being coupled to the chuck stage to rotate the chuck stage, and a heat generation part disposed in the chuck stage.

15 Claims, 7 Drawing Sheets

(56) References Cited

U.S. PATENT DOCUMENTS

| | | | | |
|---|---|---|---|---|
| 2010/0296546 A1* | 11/2010 | Weick | ................... | G01K 17/003 374/137 |
| 2011/0061810 A1* | 3/2011 | Ganguly | ............. | H01L 21/0223 156/345.27 |
| 2014/0273302 A1* | 9/2014 | Chien | ............... | H01L 21/67051 438/14 |

FOREIGN PATENT DOCUMENTS

| CN | 102792426 A | 11/2012 | | |
|---|---|---|---|---|
| JP | 2004-273912 A | 9/2004 | | |
| JP | 2006-032604 A | 2/2006 | | |
| JP | 2009-259938 A | 11/2009 | | |
| JP | 2010-245575 A | 10/2010 | | |
| JP | 5118176 B2 | 1/2013 | | |
| KR | 20120059413 A | 1/2004 | | |
| KR | 20090045984 A | 5/2009 | | |
| KR | 20120059413 * | 8/2012 | ............... | G03F 7/26 |
| KR | 20130037814 A | 4/2013 | | |
| TW | 200929418 A | 7/2009 | | |

\* cited by examiner

SUBSTRATE TREATING APPARATUS

CROSS-REFERENCE TO RELATED APPLICATIONS

This U.S. non-provisional patent application claims priority under 35 U.S.C. §119 of Korean Patent Application Nos. 10-2013-0090815, filed on Jul. 31, 2013, and 10-2013-0164394, filed on Dec. 26, 2013, the entire contents of which are hereby incorporated by reference.

BACKGROUND OF THE INVENTION

The present invention disclosed herein relates to a substrate treating apparatus, and more particularly, to a substrate treating apparatus for treating a surface of a substrate while heating the substrate.

In general, there are various processes for treating glass substrates or wafers such as a photoresist coating process, a developing process, an etching process, an ashing process, and the like in processes for manufacturing flat plate display devices or semiconductor devices.

In each of the processes, a wet cleaning process using chemical solution or deionized water and a drying process for drying the chemical solution or deionized water remaining on the substrate surfaces so as to remove various contaminants attached to the substrate.

Recently, an etching process in which a chemical aqueous solution used at a high temperature such as sulfuric acid or phosphoric acid is used to selectively remove a silicon nitride and silicon oxide is performed.

In a substrate treating apparatus using the chemical aqueous solution having the high-temperature, a substrate heating device heating a substrate to improve an etching rate and uniformity is applied and used.

However, in the existing substrate heating device, a temperature sensor for sensing a temperature of a heater is manufactured by using stainless steel. Thus, if a setting value is low, the temperature of the substrate does not reach a target temperature (for example, a temperature of about 200° C.). Also, if a second process is performed in a state where the temperature sensor is heated and then is not sufficiently cooled after a first process, the temperature of the substrate quickly reaches the setting value (a preset measurement temperature) due to the heating of the temperature sensor, and thus the substrate does not reach the target temperature. On the other hand, if the setting value of the temperature sensor is high, the sensor may cause sensing failure and malfunction.

SUMMARY OF THE INVENTION

The present invention provides a substrate treating apparatus that is capable of uniformly heating a substrate.

The present invention also provides a substrate treating apparatus that is capable of minimizing contaminant of a heating unit.

The present invention also provides a substrate treating apparatus that is capable of improving efficiency of a heating unit.

The present invention also provides a substrate treating apparatus that is capable of heating a substrate to a target temperature without overloading a temperature sensor.

The present invention also provides a substrate treating apparatus that is capable of blocking conductive heat transmitted from peripheral structures to a temperature sensor except for heat transmitted from a heat generation unit to the temperature sensor.

The present invention also provides a substrate treating apparatus that is capable of quickly reducing a temperature of a temperature sensor.

The feature of the present invention is not limited to the aforesaid, but other features not described herein will be clearly understood by those skilled in the art from descriptions below.

Embodiments of the present invention provide substrate treating apparatuses including: a treating container having an opened upper portion; a substrate heating unit heating a substrate disposed in the treating container while supporting the substrate; and a treating solution supply unit supplying a treating solution onto the substrate disposed on the substrate heating unit, wherein the substrate heating unit includes: a rotatable chuck stage on which the substrate is placed; a rotation part having a hollow shape, the rotation part being coupled to the chuck stage to rotate the chuck stage; and a heat generation part disposed in the chuck stage.

In some embodiments, the heat generation part may include lamps concentrically arranged in ring shapes having radii different from each other with respect to a center of the chuck stage.

In other embodiments, the substrate heating unit may further include a reflection plate disposed between the heat generation part and the chuck stage to reflect heat energy emitted from the heat generation part to the substrate.

In still other embodiments, the heat generation part may include lamps concentrically arranged in ring shapes having radii different from each other with respect to a center of the chuck stage, and the substrate heating unit may include temperature sensor assemblies disposed on the reflection plate to measure a temperature of each of the lamps.

In even other embodiments, the substrate heating unit may further include a quartz window for protecting the lamps on the heat generation unit, wherein the quartz window has an edge supported by the chuck stage.

In yet other embodiments, the quartz window may be transparent and rotated together with the chuck stage.

In further embodiments, the temperature sensor assembly includes: a fixing block in which a bolt coupling hole is defined to fix the temperature sensor assemblies to the reflection plate; a slim support plate extending from the fixing block in one direction, the slim support plate being spaced apart from the reflection plate; and a temperature sensor element to which a signal lead wire is connected, the temperature sensor element being disposed on a bottom surface of the support plate.

In still further embodiments, each of the temperature sensor assemblies may further include a slim cover plate configured to surround the temperature sensor element and having an edge welded and fixed to the bottom surface of the support plate.

In even further embodiments, each of the temperature sensor assemblies may further include an insulation spacer disposed between the fixing block and the reflection plate to block the heat transmitted from the reflection plate.

In yet further embodiments, in each of the temperature sensor assemblies, each of the fixing block, the support plate, and the cover plate may include a gold-plated layer.

In much further embodiments, the substrate heating apparatuses may further include a back nozzle unit disposed on a center of an upper portion of the chuck stage to pass through the rotation part, the back nozzle spraying a treating solution onto a rear surface of the substrate, wherein the back nozzle unit may include a nozzle body axially disposed to pass through the rotation part, and the nozzle body may include a spray port for spraying a cooling gas onto a bottom surface of the reflection plate in a direction in which the temperature sensor assemblies are arranged.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
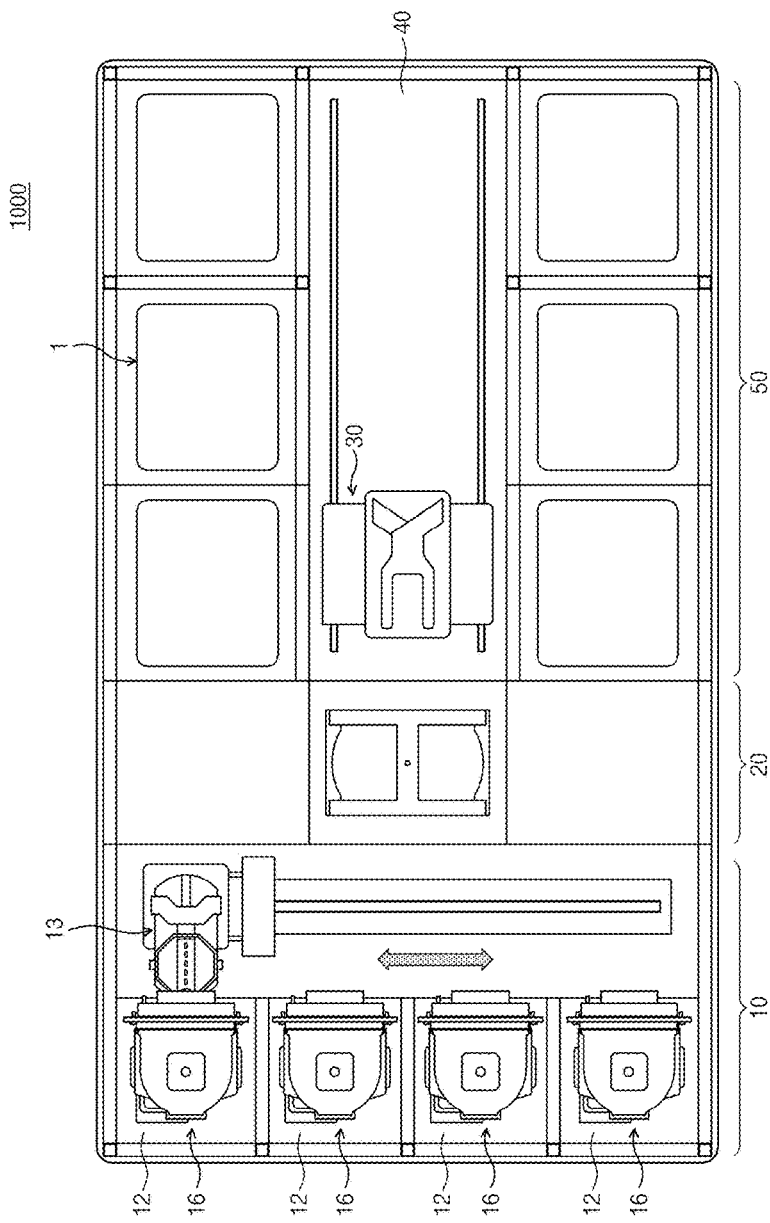
FIG. 1 is a schematic plan view of substrate treating equipment according to an embodiment of the present invention.

Referring to FIG. 1, a substrate treating system 1000 according to the present invention includes an index unit 10, a buffer unit 20, and a treating unit 50.

The index unit 10, the buffer unit 20, and the treating unit 50 may be disposed in a line. Hereinafter, a direction in which the index unit 10, the buffer unit 20, and the treating unit 50 are arranged is referred to as a first direction. Also, when viewed from an upper side, a direction perpendicular to the first direction is referred to as a second direction, and a direction perpendicular to a plane including the first and second directions is referred to as a third direction.

The index unit 10 is disposed at a front side of the substrate treating system 1000 in the first direction. The index unit 10 includes four load ports 12 and one index robot 13.

The four load ports 12 are disposed at a front side of the index unit 10 in the first direction. The load ports 12 are provided in plurality. The plurality of load ports 12 are arranged in the second direction. The number of load ports 12 may increase or decrease according to process efficiency and foot print conditions of the substrate treating system 1000. A carrier (e.g., a cassette or a FOUP) in which a substrate W to be processed and a processed substrate W is accommodated is seated on each of the load ports 12. A plurality of slots for accommodating substrates in a state where the substrates are disposed parallel to the ground are defined in the carrier 16.

The index robot 13 is disposed adjacent to the load ports 12 in the first direction. The index robot 13 is disposed between the load ports 12 and the butter unit 20. The index robot 13 transfers the substrate W waiting on an upper floor of the buffer unit 20 into the carrier 16 or transfers the substrate W waiting in the carrier 16 into a lower floor of the buffer unit 20.

The buffer unit 20 is disposed between the index unit 10 and the treating unit 50. The buffer unit 20 provides a place in which the substrate W to be transferred by the index robot 13 or the processed substrate W to be transferred by a main transfer robot 30 is temporarily accommodated or waited.

The main transfer robot 30 is disposed on a moving path 40 to transfer the substrate W between each of substrate treating apparatuses 1 and the buffer unit 20. The main transfer robot 30 transfers the substrate W to be processed, which is waited in the buffer unit 20, into each of the substrate treating apparatuses 1 or transfers the substrate W processed in each of the substrate treating apparatuses 1 into the buffer unit 20.

The moving path 40 is disposed in the treating unit 50 in the first direction to provide a path through which the main transfer robot 30 moves. The substrate treating apparatuses 1 are disposed on both sides of the moving path 40 in the first direction to face each other. A moving rail through which the main transfer robot 30 moves in the first direction and is elevatable to upper and lower floors of each of the substrate treating apparatuses 1 and the upper and lower floors of the buffer unit 20 is disposed in the moving path 40.

The substrate treating apparatuses 1 are disposed on both sides of the moving path 40 in which the main transfer robot 30 is disposed to face each other. The substrate treating system 1000 includes the plurality of upper and lower substrate treating apparatuses 1. However, the number of substrate treating apparatuses 1 may increase or decrease according to the process efficiency and foot print conditions of the substrate treating system 1000. Each of the substrate treating apparatuses 1 may be provided as an independent housing. Thus, a process for treating a substrate may be separately performed within each of the substrate treating apparatuses 1.

In following embodiments, an apparatus for cleaning a substrate by using treating fluids such as high-temperature sulfuric acid, alkaline chemical solution (including ozone water), acid chemical solution, rising solution, dry gas (gas containing IPA) may be described as an example. However, technical features of the present invention are not limited thereto. For example, the technical features of the present invention may be applied to various kinds of apparatuses which perform a process while rotating a substrate, such as an etching process.

Figure 2:
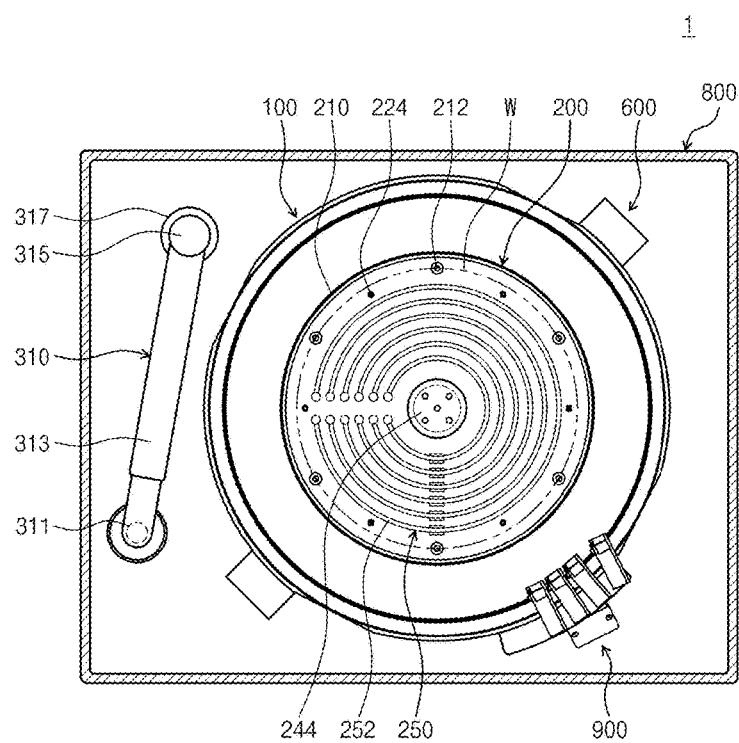
FIG. 2 is a plan view of a substrate treating apparatus of FIG. 1.
Figure 3:
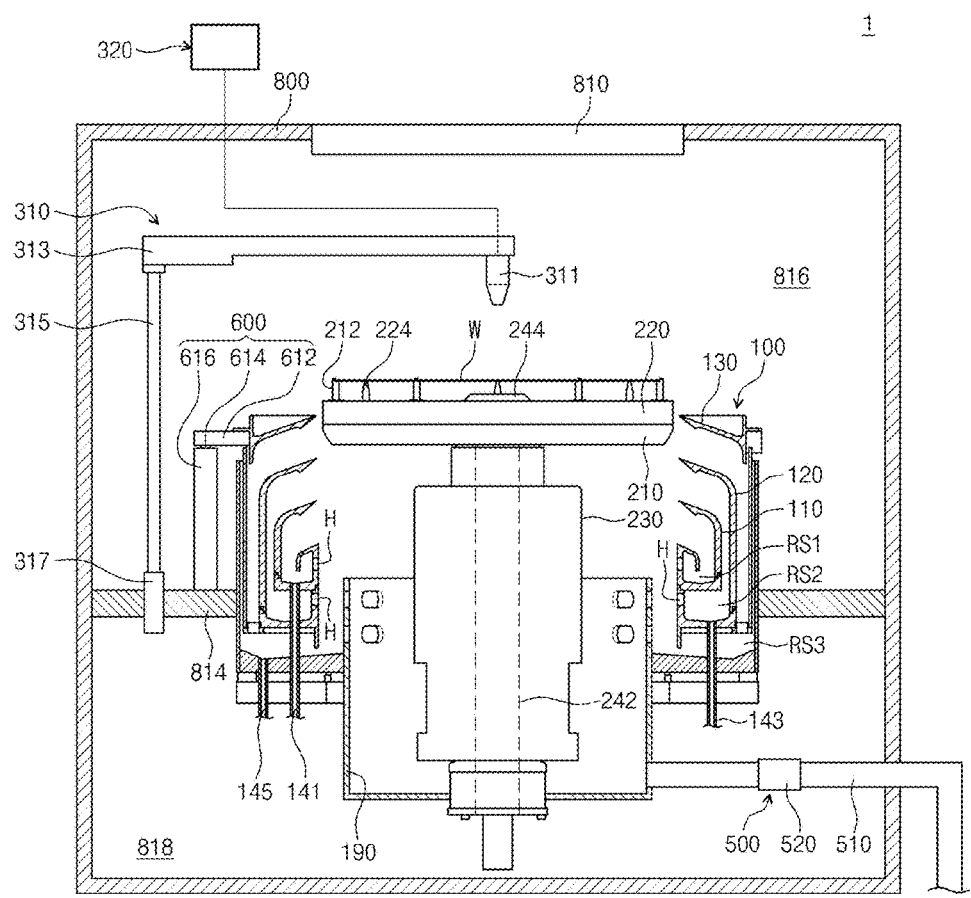
FIG. 3 is a side cross-sectional view of the substrate treating apparatus according to the present invention.

FIG. 2 is a plan view of a substrate treating apparatus of FIG. 1, and FIG. 3 is a side cross-sectional view of the substrate treating apparatus according to the present invention;

In the current embodiment, although the semiconductor substrate is exemplified and described as a substrate processed by the substrate treating apparatus 1, the present invention is not limited thereto. For example, the substrate treating apparatus 1 may be applied to various kinds of substrates such as a substrate for a liquid crystal display device, a substrate for a plasma display, a substrate for a field emission display, a substrate for an optical disc, a substrate for a magnetic disc, a substrate for an optical-magnetic disc, a substrate for a photo mask, a ceramic substrate, and a substrate for a solar cell.

Referring to FIGS. 2 and 3, the substrate treating apparatus 1 according to the present invention may be an apparatus for removing foreign substances and membranes, which remain on a surface of the heated substrate by using various treating fluids. The substrate treating apparatus 1 includes a chamber 800, a treating container 100, a substrate heating unit 200, a chemical solution supply member 300, a fixed nozzle 900, and a process exhaust unit 500.

The chamber 800 provides a sealed inner space, and a fan filter unit 810 is disposed on an upper portion thereof. The fan filter unit 810 generates vertical air current within the chamber 800.

A filter and an air supply fan are modularized as one unit to constitute the fan filter unit 810. The fan filter unit 810 may be a unit for filtering high-humidity air to supply the air into the chamber 800. The high-humidity air may pass through the fan filter unit 810 and be supplied into the chamber 800 to generate the vertical air current. The vertical air current may provide uniform air current on the substrate. Thus, contaminants (fume) generated while a surface of a substrate is processed by a treating fluid are discharged together with the air through suction ducts of the treating container 100 into the process exhaust unit 500 and thus are removed to maintain high purity in the treating container 100.

As shown in FIG. 3, the chamber 800 may be partitioned into a process region 816 and a repairing region 818 by a horizontal partition wall 814. Although only portions of the regions are illustrated in drawings, the repairing region 818 provides a space in which discharge lines 141, 143, and 145 and a exhaust line 510 which are connected to the treating container 100, a driving unit of an elevation unit, a driving unit connected to first nozzles 310 of the chemical solution supply member 300, and a supply line are disposed, and the repairing area 818 is isolated from the process region in which the substrate is processed.

The treating container 100 has a cylindrical shape with an opened upper portion to provide a process space for treating the substrate W. The opened upper portion of the treating container 100 serves as a path for loading or unloading the substrate W. The substrate heating unit 200 is disposed in the process space. The substrate heating unit 200 heats the substrate W in a state where the substrate W is supported and rotates the substrate W during the process.

The treating container 100 provides a lower space to which the exhaust duct 190 is connected on a lower end to forcibly exhaust the air. First, second, and third suction ducts 110, 120, and 130 each having an annular shape to introduce and suction chemical solutions and gases scattered from the rotating substrate are disposed in the treating container 100 in multi-stages.

The first, second, and third suction ducts 110, 120, and 130 each having the annular shape have exhaust holes H communicating with one common annular space (corresponding to a lower space of the container). The exhaust duct 190 connected to the exhaust member 400 is disposed in the lower space.

In detail, each of the first to third suction ducts 110, 120, and 130 includes a bottom surface having an annular ring shape and a sidewall extending from the bottom surface and having a cylindrical shape. The second suction duct 120 surrounds the first suction duct 110 and is spaced apart from the first suction duct 110. The third suction duct 130 surrounds the second suction duct 120 and is spaced apart from the second suction duct 120.

The first to third suction ducts 110, 120, and 130 provide first to third recovery spaces RS1, RS2, and RS3 through which the treating solution scattered from the substrate W and the air current containing the fume are introduced, respectively. The first recovery space RS1 is defined by the first suction duct 110, and the second recovery space RS2 is defined by a space spaced between the first suction duct 110 and the second suction duct 120. The third recovery space RS3 is defined by a space spaced between the second suction duct 120 and the third suction duct 130.

A top surface of each of the first to third suction ducts 110, 120, and 130 includes an opened central portion and an inclined surface which is gradually away from a corresponding bottom surface from the connected sidewall toward the opening thereof. Thus, the treating solution scattered from the substrate W may flow into the recovery spaces RS1, RS2, and RS3 along the top surfaces of the first to third suction ducts 110, 120, and 130.

A first treating solution introduced into the first recovery space RS1 is discharged to the outside through a first recovery line 141. A second treating solution introduced into the second recovery space RS2 is discharged to the outside through a second recovery line 143. A third treating solution introduced into the second recovery space RS3 is discharged to the outside through a third recovery line 145.

The process exhaust part 500 exhausts the air in the treating container 100. For example, the process exhaust part 500 provides an exhaust pressure (a suction pressure) to the suction duct, which recovers the treating solution, of the first to third suction ducts during the process. The process exhaust part 500 includes the exhaust line 510 connected to the exhaust duct 190 and a damper 520. The exhaust line 510 receives an exhaust pressure from an exhaust pump (not shown) and is connected to a main exhaust line buried in a bottom space of a semiconductor production line (FAB).

The treating container 100 is coupled to an elevation unit 600 for changing a vertical position of the treating container 100. The elevation unit 600 straightly moves the treating container 100 in a vertical direction. As the treating container 100 vertically moves, a relative height of the treating container 100 with respect to the substrate heating unit 200 may change.

The elevation unit 600 includes a bracket 612, a moving shaft 614, and a driver 616. The bracket 612 is fixed to an outer wall of the treating container 100. The moving shaft 614 that is vertically moving by the driver 616 is fixedly coupled to the bracket 612. When the substrate W is loaded into or unloaded from the spin head 210, the treating container 100 descends so that the spin head protrudes upward from the treating container 100. Also, while the process is performed, the treating container 100 may be adjusted in height so that the treating solutions are respectively introduced into the suction ducts 110, 120, and 130 according to kinds of treating solutions supplied onto the substrate W. Thus, a relative vertical position between the treating container 100 and the substrate W may change. Thus, in the treating container 100, different treating solutions and gases may be recovered into the recovery spaces RS1, RS2, and RS3, respectively.

In the current embodiment, the substrate treating apparatus 1 vertically moves the treating container 100 to change a relative vertical position between the treating container 100 and the substrate heating unit 200. Alternatively, the substrate treating apparatus 1 may vertically move the substrate heating unit 200 to change a relative vertical position between the treating container 100 and the substrate heating unit 200.

Fixed nozzles 900 are disposed on an upper end of the treating container 100. Each of the fixed nozzles 900 sprays the treating fluid onto the substrate W placed on the spin head 210. A spraying angle of the fixed nozzle 900 may be adjusted according to a position of the substrate to be processed.

The chemical solution supply member 300 discharges high-temperature chemicals for etching a surface of the substrate W. Here, the chemicals may be sulfuric acid, phosphoric acid, or a mixed solution of sulfuric acid and phosphoric acid.

The chemical solution nozzle member 310 includes a nozzle 311, a nozzle arm 313, a support rod 315, and a nozzle driver 317. The nozzle 311 receives phosphoric acid through the supply part 320. The nozzle 311 discharges the phosphoric acid onto the surface of the substrate. The nozzle arm 313 may be an arm that lengthily extends in one direction. The nozzle 311 is mounted on a front end of the nozzle arm 313. The nozzle arm 313 supports the nozzle 311. The support rod 315 is mounted on a rear end of the nozzle arm 313. The support rod 315 is disposed below the nozzle arm 313 and is disposed perpendicular to the nozzle arm 313. The nozzle driver 317 is disposed on a lower end of the support rod 315. The nozzle driver 317 rotates the support rod 315 with respect to an axis of the support rod 315 in a longitudinal direction. The support rod 315 is rotated to swing the nozzle arm 313 and the nozzle 311 with respect to the support rod 315. The nozzle 311 may swing between the outside and the inside of the treating container 100. Also, the nozzle 311 may discharge the phosphoric acid while swing between a center and an edge of the substrate W.

Although not shown, a single-wafer type treating apparatus 1 may include supply members for spraying various treating fluids onto the substrate in addition to the chemical solution supply member 300.

Figure 4:
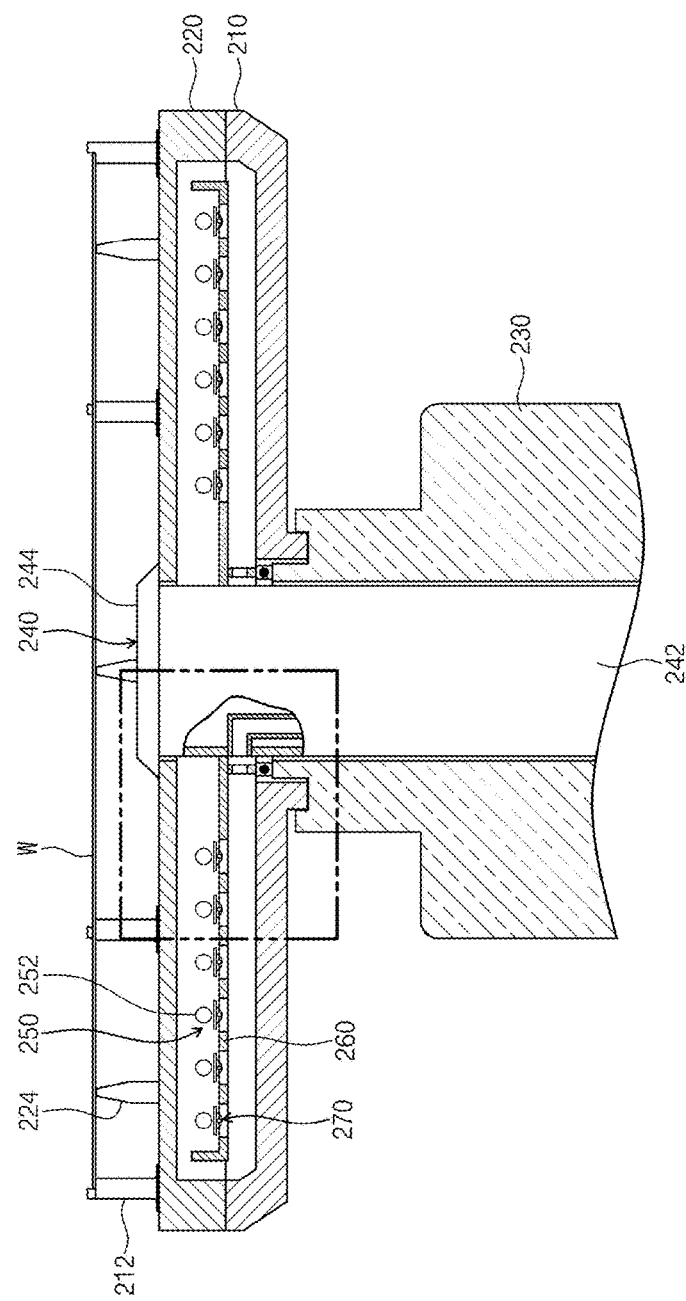
FIG. 4 is a cross-sectional view of a substrate heating unit.
Figure 5:
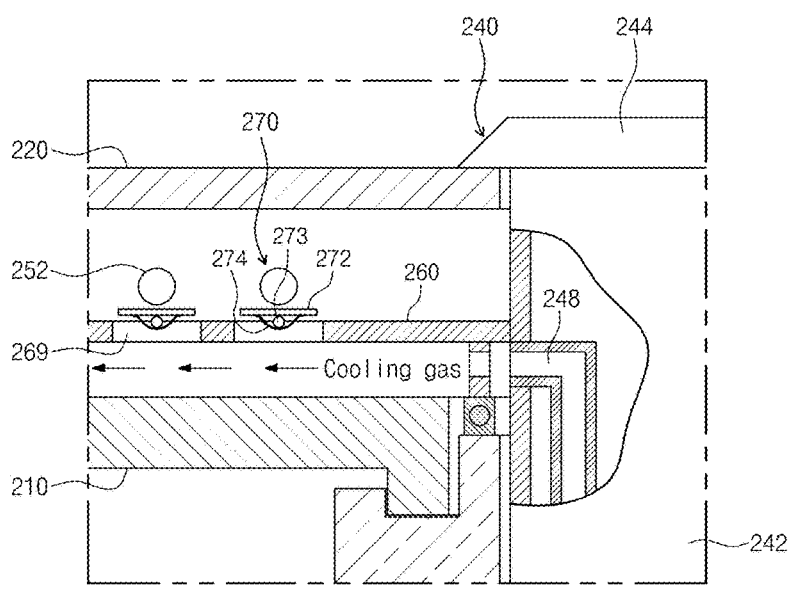
FIG. 5 is a view illustrating a main part of the substrate heating unit of FIG. 4.

FIG. 4 is a cross-sectional view of a substrate heating unit, and FIG. 5 is a view illustrating a main part of the substrate heating unit of FIG. 4.

Referring to FIGS. 2 to 5, the substrate heating unit 200 is disposed inside the treating container 100. The substrate heating unit 200 heats the substrate while the process is performed. The substrate heating unit 200 may support the substrate W while the process is performed. Also, the substrate heating unit 200 may rotate by the driver 240 that will be described later while the process is performed.

The substrate heating unit 200 includes a chuck stage 210, a quartz window 220, a rotation part 230, a back nozzle part 240, a heat generation part 250, a reflection plate 260, and a temperature sensor assembly 270.

The chuck stage 210 has a top surface having a circular shape and is coupled to the rotation part 230 to rotate. Chucking pins 212 are disposed on edges of the chuck stage 210. The chucking pins 212 pass through the quartz window 220 to protrude upward from the quartz window 220. The chucking pins 212 align the substrate W so that the substrate W supported by the plurality of support pins 224 is placed in a proper position. While the process is performed, the chucking pins 212 contact side portions of the substrate W to prevent the substrate W from getting out of the proper position.

The rotation part 230 has a hollow shape and is coupled to the chuck stage 210 to rotate the chuck stage 210.

The heat generation part 250 for heating the substrate at a temperature of about 150° C. to about 250° C. is disposed on an upper portion of the chuck stage 210. The heat generation part 250 have diameters different from each other and are spaced apart from each other. Each of the heat generation part 250 has a plurality of IR lamps 252, each of which has a ring shape. Each of the IR lamps 252 includes a temperature sensor assembly 270 to separately control the IR lamps 252.

The heat generation part 250 may be divided into a plurality of concentric areas. The IR lamps 252 for individually heating each of the areas are disposed in each of the areas. The IR lamps 252 are concentrically arranged in a ring shape at different radial distances with respect to a center of the chuck stage 210. Although six IR lamps 252 are provided in the current embodiment, this may be a mere example. The IR lamps may vary in number depending on a controlled desired temperature. As described above, since the heat generation part 250 controls a temperature of each individual area, a temperature of the substrate W may be gradually controlled (i.e., successive increase or decrease in temperature) according to a radius of the substrate during the process. For this, the temperature sensor assembly 270 for individually checking temperatures of the IR lamps 252 is disposed on the reflection plate 260.

For example, in a structure in which the IR lamps 252 rotate together with the chuck stage 210, a slip ring may be used in a method in which a power is supplied into the heat generation part 250.

The reflection plate 260 may be disposed between the heat generation part 250 and the chuck stage 210 to transfer heat generated from the IR lamps 252 upward (toward the substrate). The reflection plate 260 may be supported by a nozzle body passing through a central space of the rotation part 230. Also, the reflection plate 260 includes a support end 268 extending downward from an inner end thereof and then is supported by the rotation part 230 through a bearing 232 so that the reflection plate 260 is stably supported. Here, the fitted-type reflection plate 260 that is not rotated together with the chuck stage 210 may be provided.

Although not shown, cooling fins may be disposed on the reflection plate 260 to release heat. Also, a cooling gas may flow over a bottom surface of the reflection plate 260 so as to restrain the heat generation. For example, the nozzle body 242 includes a spray port 248 for spraying the cooling gas onto the bottom surface of the reflection plate in a direction in which the temperature sensor assemblies are arranged.

The quartz window 220 for protecting the IR lamps 252 may be disposed between heat generation part 250 and the substrate W. The quartz window 220 may be transparent and also be rotated together with the chuck stage 210. The quarts window 220 includes the support pins 224. The support pins 224 are arranged spaced apart from each other on an edge of a top surface of the quarts window 220. Also, the support pins 224 protrude upward from the quartz window 220. The support pins 224 support the bottom surface of the substrate W so that the substrate W is supported in a state where the substrate W is spaced upward from the quartz window 220.

A back nozzle part 240 is configured to spray the chemical solution onto a back surface of the substrate. The back nozzle part 240 includes the nozzle body 242 and a chemical solution spray member 244. The chemical solution spray member 244 is disposed on a central portion of the chuck stage 210 and the quartz window 220. The nozzle body 242 is axially disposed to pass through the rotation part 230 having a hollow shape. Although not shown, a chemical solution moving line, a gas supply line, and a purge gas supply line may be disposed in the nozzle body 242. An etching solution for etching the back surface of the substrate W is supplied into the chemical solution spray member 244 through the chemical moving line, a nitrogen gas for adjusting etching uniformity is supplied onto the back surface of the substrate W through the gas supply line, and a nitrogen purge gas is supplied through the purge gas supply line to prevent the etching solution from being penetrated between the quartz window 220 and the nozzle body 242.

The temperature sensor assemblies 270 are arranged in a line on the reflection plate 260 to measure a temperature of each of the IR lamps 252.

Figure 6A:
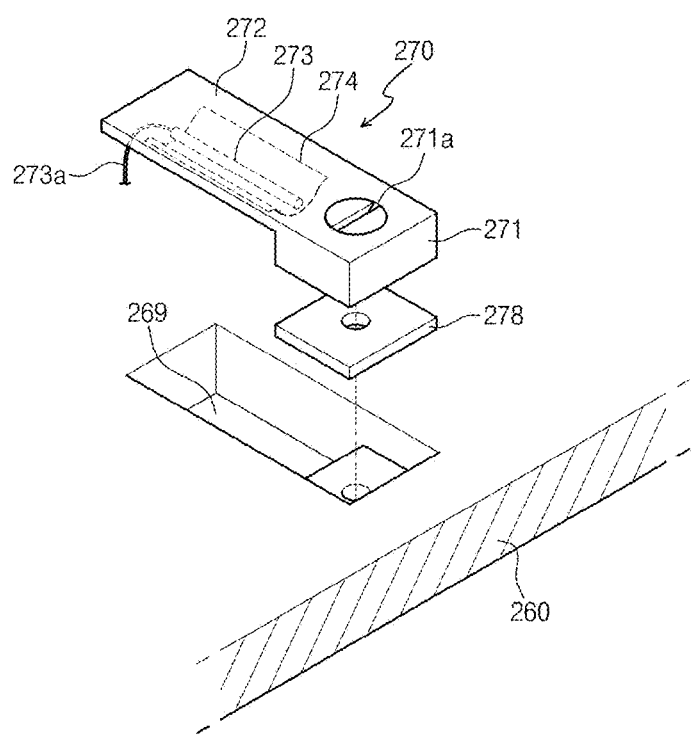
FIGS. 6A and 6B are views illustrating of a temperature sensor assembly disposed on a reflection plate.
Figure 6B:
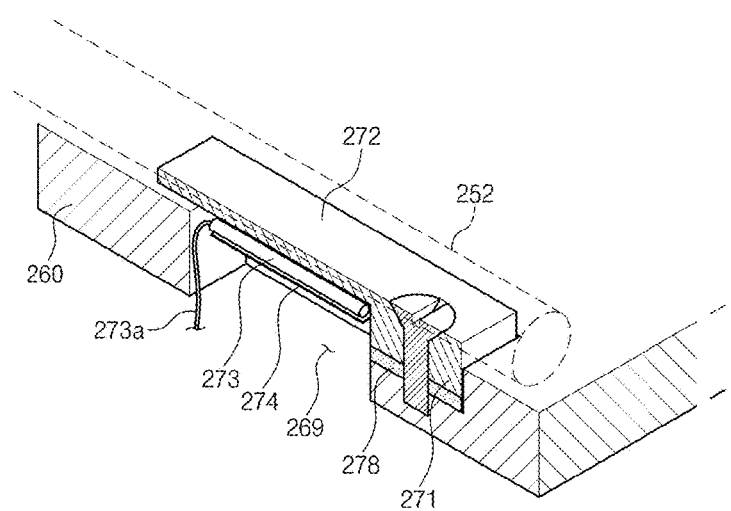

FIGS. 6A and 6B are views illustrating of a temperature sensor assembly disposed on a reflection plate.

The temperature sensor assembly 270 includes a fixing block 271, a support plate 272, a temperature sensor element 273, a cover plate 274, and an insulation spacer 278. The temperature sensor assembly 270 may have a structure in which a slim temperature sensor assembly is mounted on the reflection plate 260 that is disposed nearby the IR lamp to accurately measure the temperature of the IR lamp so as to measure and control the temperature of the IR lamp. That is, the temperature sensor assembly has a structure suitable for a small space.

The fixing block 271 includes a bolt coupling hole 271*a* to fix the temperature sensor assembly 270 to the reflection plate 260. The support plate 271 has a slim shape and extends in one side of the fixing block 271. The support plate 272 is spaced apart from a top surface of the reflection plate 260. A through hole 269 is defined in a portion of the reflection plate 260, which faces the support plate 272. Thus, the cooling gas flowing along the bottom surface of the reflection plate 260 may cool the temperature sensor assembly 270 through the through hole 269. A signal lead wire 273*a* is connected to the temperature sensor element 273. The temperature sensor element 273 is disposed on a bottom surface of the support plate 272. The temperature sensor element 273 is surrounded and supported by the cover plate 274 of which an edge is welded and fixed to the bottom surface of the support plate 272. That is, the temperature sensor element 273 is not directly fixed to the support plate 272, but is fixed in a state where the temperature sensor element 273 is held by the cover plate 274.

The insulation spacer 278 is disposed on a bottom surface of the fixing block 271. That is, the insulation spacer 278 is inserted between the fixing block 271 and the reflection plate 260 to block conductive heat transmitted from the reflection plate 260 to the temperature sensor assembly 270.

According to the present invention, the substrate treating apparatus may uniformly heat the substrate.

According to the present invention, the substrate treating apparatus may minimize the contaminant of the heating member.

According to the present invention, the substrate treating apparatus may increase efficiently of the heating member.

According to the present invention, the temperature sensor assembly may minimize the heat transmitted from the reflection plate to measure the heat of only the IR lamp and thus may set the setting value of the temperature sensor to a low value to heat the substrate at the target temperature without being overloaded and may equalize the temperatures of the temperature sensor in the processes to reduce an error between the processes.

According to the present invention, since the fixing block, the support plate, and the cover plate of the temperature sensor assembly are gold-plated, the heat transmitted from the reflection plate is filtered to reduce the setting value of the temperature sensor, thereby securing non-stressful operation of the temperature sensor.

According to the present invention, since the support plate on which the temperature sensor element is mounted is disposed adjacent to the through hole defined in the reflection plate, the support plate may be cooled by the cooling gas. Therefore, the temperature of the temperature sensor heated after the first process may be reduced for a short time to perform the second process, and thus the process time and a deviation of the substrate hating time may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
   a treating device having an opened upper portion;
   a substrate heating unit configured to heat a substrate in the treating device while supporting the substrate, the substrate heating unit including,
      a rotatable chuck stage configured to support the substrate when the substrate is placed thereon,
      a plurality of heat generators concentrically arranged on an upper surface of the rotatable chuck stage,
      a rotator having a cavity therein, the rotator coupled to the rotatable chuck stage to rotate the rotatable chuck stage together with the plurality of heat generators, and
      a plurality of temperature sensor assemblies between respective ones of the heat generators and the rotatable chuck stage such that the plurality of temperature sensor assemblies are directly below respective ones of the heat generators and rotate together with the heat generators; and
   a treating solution supply configured to supply a treating solution toward the substrate.

2. The substrate treating apparatus of claim 1, wherein the plurality of heat generators each include lamps arranged in a ring shape such that the lamps associated with each of the plurality of heat generators have radii different from each other with respect to a center of the rotatable chuck stage.

3. The substrate treating apparatus of claim 1, wherein the substrate heating unit further comprises:
   a reflection plate between the plurality of heat generators and the rotatable chuck stage to reflect heat energy emitted from the plurality of heat generators to the substrate.

4. The substrate treating apparatus of claim 3, wherein the plurality of heat generators each include lamps arranged in a ring shape such that the lamps associated with each of the plurality of heat generators have radii different from each other with respect to a center of the rotatable chuck stage, and
   the plurality of temperature sensor assemblies are on the reflection plate, the plurality of temperature sensor assemblies configured to measure a temperature of respective ones of the lamps.

5. The substrate treating apparatus of claim 2, wherein the substrate heating unit further comprises:
   a quartz window configured to protect the lamps, the quartz window including an edge supported by the rotatable chuck stage.

6. The substrate treating apparatus of claim 5, wherein the quartz window is transparent and rotates together with the rotatable chuck stage.

7. The substrate treating apparatus of claim 4, wherein each of the plurality of temperature sensor assemblies comprises:

a fixing block having a bolt coupling hole configured to fix the plurality of temperature sensor assemblies to the reflection plate;

a slim support plate extending from the fixing block in one direction, the slim support plate being spaced apart from the reflection plate; and a temperature sensor having a signal lead wire connected thereto, the temperature sensor being on a bottom surface of the slim support plate.

8. The substrate treating apparatus of claim 7, wherein each of the plurality of temperature sensor assemblies further comprises:

a slim cover plate configured to surround the temperature sensor, the slim cover plate having an edge welded to the bottom surface of the slim support plate.

9. The substrate treating apparatus of claim 7, wherein each of the plurality of temperature sensor assemblies further comprises:

an insulation spacer between the fixing block and the reflection plate to block the heat transmitted from the reflection plate.

10. The substrate treating apparatus of claim 7, wherein, in each of the plurality of temperature sensor assemblies, each of the fixing block, the slim support plate, and the slim cover plate includes a gold-plated layer.

11. The substrate treating apparatus of claim 4, further comprising:

a back nozzle on a center of the upper surface of the rotatable chuck stage such that the back nozzle passes through the rotator, the back nozzle configured to spray the treating solution onto a rear surface of the substrate, the back nozzle including a nozzle body axially passing through the rotator, the nozzle body including a spray port configured to spray a cooling gas onto a bottom surface of the reflection plate in a direction in which the plurality of temperature sensor assemblies are arranged.

12. The substrate treating apparatus of claim 8, wherein each of the plurality of temperature sensor assemblies further comprises:

an insulation spacer between the fixing block and the reflection plate to block the heat transmitted from the reflection plate.

13. A substrate heating apparatus comprising:

a chuck configured to support a substrate when the substrate is placed thereon;

a plurality of heat generators concentrically arranged on an upper surface of the chuck;

a rotator coupled to the chuck, the rotator being configured to rotate the chuck together with the plurality of heat generators; and a plurality of temperature sensor assemblies between respective ones of the plurality of heat generators and the chuck such that the plurality of temperature sensor assemblies are directly below respective ones of the heat generators and rotate together with the heat generators.

14. The substrate heating apparatus of claim 13, wherein the plurality of heat generators each include lamps arranged in a ring shape such that the lamps associated with each of the plurality of heat generators have radii different from each other with respect to a center of the chuck.

15. The substrate heating apparatus of claim 14, wherein each of the plurality of temperature sensor assemblies is configured to measure a temperature of respective ones of the lamps.

* * * * *